United States Patent
Lu et al.

(10) Patent No.: US 12,216,434 B2
(45) Date of Patent: Feb. 4, 2025

(54) TIME TO DIGITAL CONVERTER (TDC) CIRCUIT WITH SELF-ADAPTIVE TIME GRANULARITY AND RELATED METHODS

(71) Applicant: Microsoft Technology Licensing, LLC, Redmond, WA (US)

(72) Inventors: Ping Lu, Cary, NC (US); Minhan Chen, Cary, NC (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/828,538

(22) Filed: May 31, 2022

(65) Prior Publication Data
US 2023/0384738 A1 Nov. 30, 2023

(51) Int. Cl.
*G04F 10/00* (2006.01)
*H03L 7/10* (2006.01)

(52) U.S. Cl.
CPC ............ *G04F 10/005* (2013.01); *H03L 7/103* (2013.01)

(58) Field of Classification Search
None
See application file for complete search history.

(56) References Cited

U.S. PATENT DOCUMENTS

| | | | | |
|---|---|---|---|---|
| 6,501,706 B1 * | 12/2002 | West | ........................ | G04F 10/06 368/118 |
| 7,893,861 B2 * | 2/2011 | Bulzacchelli | ........... | H03M 1/20 341/166 |
| 7,968,849 B2 * | 6/2011 | Ohtani | .................... | A61B 6/037 250/363.03 |
| 9,354,332 B2 * | 5/2016 | Zwaans | .................. | G01T 1/2985 |
| 9,432,025 B1 * | 8/2016 | Khor | ...................... | H03L 7/0891 |
| 9,742,549 B1 * | 8/2017 | Wang | ..................... | H04J 3/0647 |
| 10,509,104 B1 * | 12/2019 | Dato | ........................ | G01S 13/87 |
| 10,831,159 B2 * | 11/2020 | Khoury | ................. | G04F 10/005 |

(Continued)

FOREIGN PATENT DOCUMENTS

EP        3340468 A1    6/2018

OTHER PUBLICATIONS

"International Search Report and Written Opinion Issued in PCT Application No. PCT/US23/018259", Mailed Date: Aug. 1, 2023, 13 Pages. (MS# 411282-WO-PCT).

*Primary Examiner* — Thomas J. Hiltunen
*Assistant Examiner* — Khareem E Almo
(74) *Attorney, Agent, or Firm* — Withrow & Terranova, PLLC

(57) ABSTRACT

A time-to-digital converter (TDC) circuit generates a digital output indicating a time, known as a phase difference, from a phase of the generated signal to a corresponding phase of a reference signal. The digital output is used by the digitally controlled oscillator (DCO) to correct for the phase/frequency difference to synchronize the generated signal with the reference signal. In an aspect, an adaptive TDC circuit generates a first digital indication in a coarse mode when the offset time is above a threshold and generates a second digital indication in a fine mode when the offset time is below the threshold. The first digital indication and the second digital indication each comprise a same number of bits, and the first digital indication is normalized to the second digital indication for the digital output of the adaptive TDC circuit. A fractional bit may be employed to compensate for a quantization error.

20 Claims, 10 Drawing Sheets

(56) References Cited

U.S. PATENT DOCUMENTS

2007/0273569 A1  11/2007  Lin
2012/0068077 A1*  3/2012  Frach .................. H03M 1/0827
                                                        250/369
2022/0029779 A1  1/2022  Lee et al.

* cited by examiner

TIME TO DIGITAL CONVERTER (TDC) CIRCUIT WITH SELF-ADAPTIVE TIME GRANULARITY AND RELATED METHODS

FIELD OF THE DISCLOSURE

The technology of the disclosure relates in general to signal generation circuits and, more particularly, to phase-locked-loops (PLL) for stabilizing signal frequency.

BACKGROUND

Wireless communication is utilized in smart telephones and other mobile devices in an ever-increasing number of applications. The fifth-generation new radio (5G-NR) technology supports high-speed cellular communication and the Internet of Things over several different frequency bands in a wide range of frequencies. Wired transmission media also supports multiple simultaneous transmissions using frequency division methods. To avoid interference between signals transmitted simultaneously over the same wired and wireless transmission media, the transmitted signals need to be kept at frequencies that are within their allocated frequency bands. In this regard, a transmitter includes a phase-locked-loop (PLL) circuit to keep the frequencies of transmitted signals within designated ranges. The PLL detects a phase difference between a transmitted signal and a reference signal at a reference frequency. The PLL generates an adjustment signal based on the phase difference. If the oscillator generating the transmitted signal is a digitally controlled oscillator (DCO), the frequency of the transmitted signal is based on a digital control signal. A time-to-digital converter (TDC) in the PLL generates a digital adjustment signal to adjust the digital control signal based on the phase difference, which is a time period between a phase of the transmitted signal and the same phase of the reference signal. The DCO adjusts the frequency of the transmitted signal based on the digital adjustment signal to synchronize the transmitted signal with the reference signal. Accuracy of the PLL can be increased by a digital adjustment signal with higher resolution. However, higher resolution means more bits, which requires more circuitry, increasing the circuit area of the PLL and consuming more power. Although a lower resolution digital adjustment signal requires fewer circuits in the PLL, employing a digital adjustment signal with lower resolution reduces the accuracy of the PLL and also increases the noise interference imposed on the transmitted signal by the digital adjustment signal. It would be beneficial to increase PLL resolution without increasing the PLL circuitry.

SUMMARY

Exemplary aspects disclosed herein include a time-to-digital converter (TDC) circuit with self-adaptive time granularity. Related methods of converting time to a digital value are also disclosed. A digitally controlled oscillator (DCO) in a phase-locked loop (PLL) generates periodic signal whose phase and frequency are controlled by digital signals. A TDC circuit generates a digital output indicating a time, known as a phase difference, from a phase of the generated signal to a corresponding phase of a reference signal. The digital output is used by the DCO to correct for the phase difference to synchronize the generated signal with the reference signal. In an aspect, an adaptive TDC circuit generates a first digital indication in a coarse mode when the offset time is above a threshold and generates a second digital indication in a fine mode when the offset time is below the threshold. The first digital indication and the second digital indication each comprise a same number of bits, and the first digital indication is normalized to the second digital indication for the digital output of the adaptive TDC circuit. In some examples, a fractional bit may be employed in the fine mode to modify the digital output of the adaptive TDC circuit to compensate for a quantization error for greater accuracy. In this manner, the adaptive TDC circuit can correct for a large initial phase difference and also provide high accuracy with a reduced amount of circuitry. In some examples, the adaptive TDC circuit switches from the coarse mode to the fine mode in response to the time period being less than the threshold.

In exemplary aspects disclosed herein, an adaptive TDC circuit is disclosed. The adaptive TDC circuit comprises a start input, a stop input, a first TDC circuit, and a second TDC circuit. The first TDC circuit is configured to, in a coarse mode, generate a first digital indication of a first time period from a start signal received at the start input to a stop signal received at the stop input. In a fine mode, the second TDC circuit is configured to generate a second digital indication of a second time period from the start signal received at the start input to the stop signal received at the stop input. The first digital indication and the second digital indication each comprise a first number of bits; the first digital indication comprising a first digital value indicates a longer first time period than the second time period indicated by the second digital indication comprising the first digital value.

In another exemplary aspect, a PLL circuit is disclosed. The PLL circuit includes a phase and frequency detection (PFD) circuit configured to generate a start signal and a stop signal separated by a time period based on a difference between a generated signal and a reference signal. The PLL circuit includes an adaptive TDC circuit comprising a start input, a stop input, a first TDC circuit, and a second TDC circuit. In a coarse mode, the first TDC circuit is configured to generate a first digital indication of a first time period from a start signal received at the start input to a stop signal received at the stop input. In a fine mode, the second TDC circuit is configured to generate a second digital indication of a second time period from the start signal received at the start input to the stop signal received at the stop input. The first digital indication and the second digital indication each comprise a first number of bits; the first digital indication comprising a first digital value indicates a longer first time period than the second time period indicated by the second digital indication comprising the first digital value. The PLL circuit also includes a loop filter circuit coupled to the adaptive TDC circuit and a DCO coupled to the loop filter circuit and configured to modify the generated signal based on the first digital indication in the coarse mode and based on the second digital indication in the fine mode.

In additional exemplary aspects, a method of converting time to a digital value in an adaptive TDC circuit is disclosed. The method comprises receiving a start signal, receiving a stop signal, generating, in a coarse mode, a first digital indication of a first time period from the start signal to the stop signal, and generating, in a fine mode, a second digital indication of a second time period from the start signal to the stop signal. In the method, the first digital indication and the second digital indication each comprise a first number of bits, and the first digital indication comprising a first digital value indicates a longer first time period than the second time period indicated by the second digital indication comprising the first digital value.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

Figure 7:
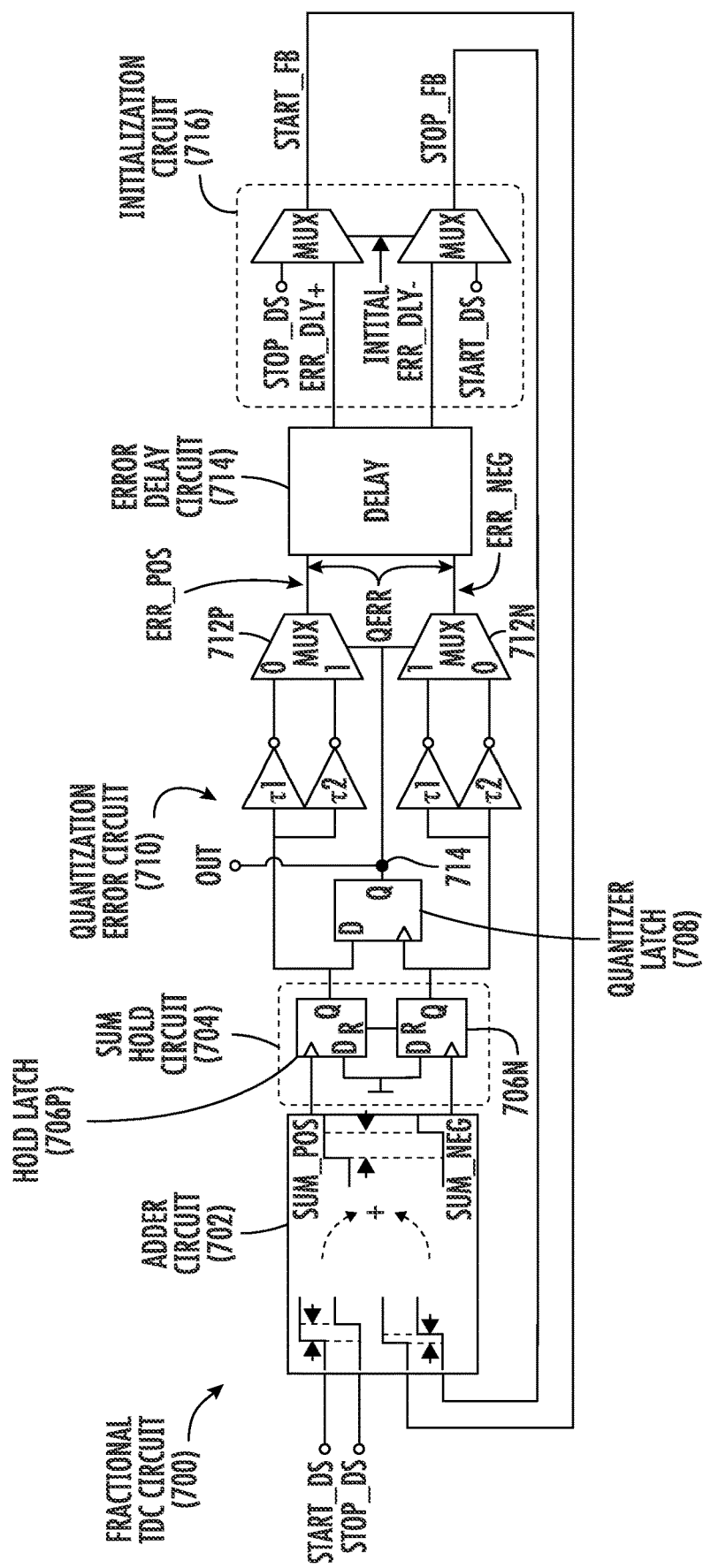
FIG. 7 is a schematic diagram of the fractional TDC circuit in FIGS. 4 and 6.
Figure 9A:
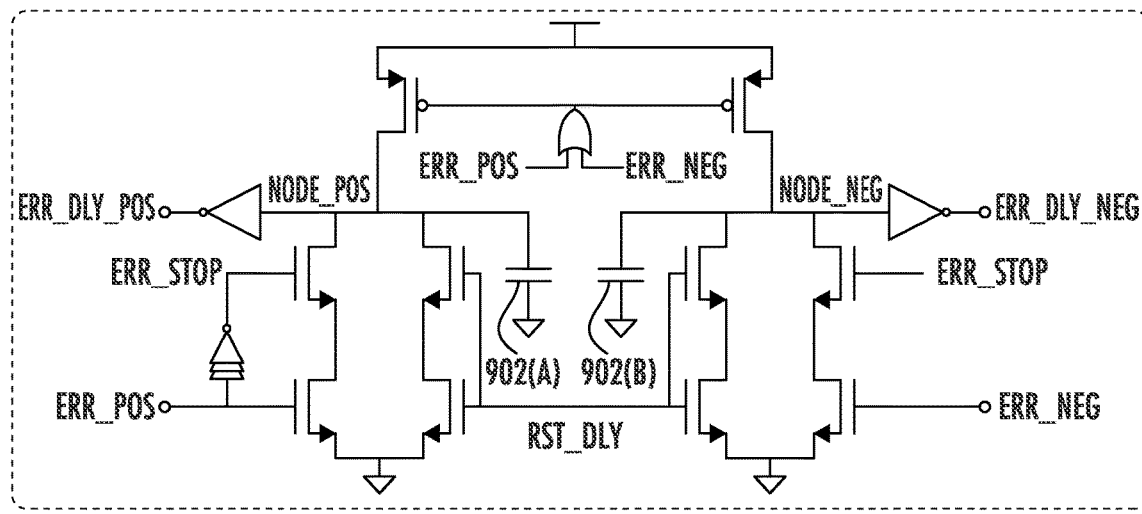
Figure 9B:
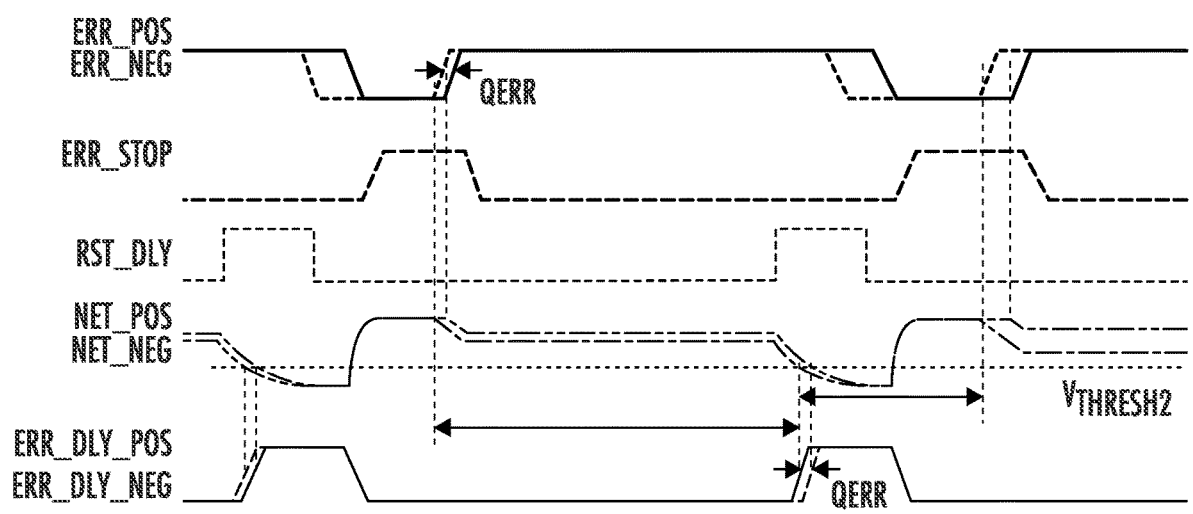
Figure 10:
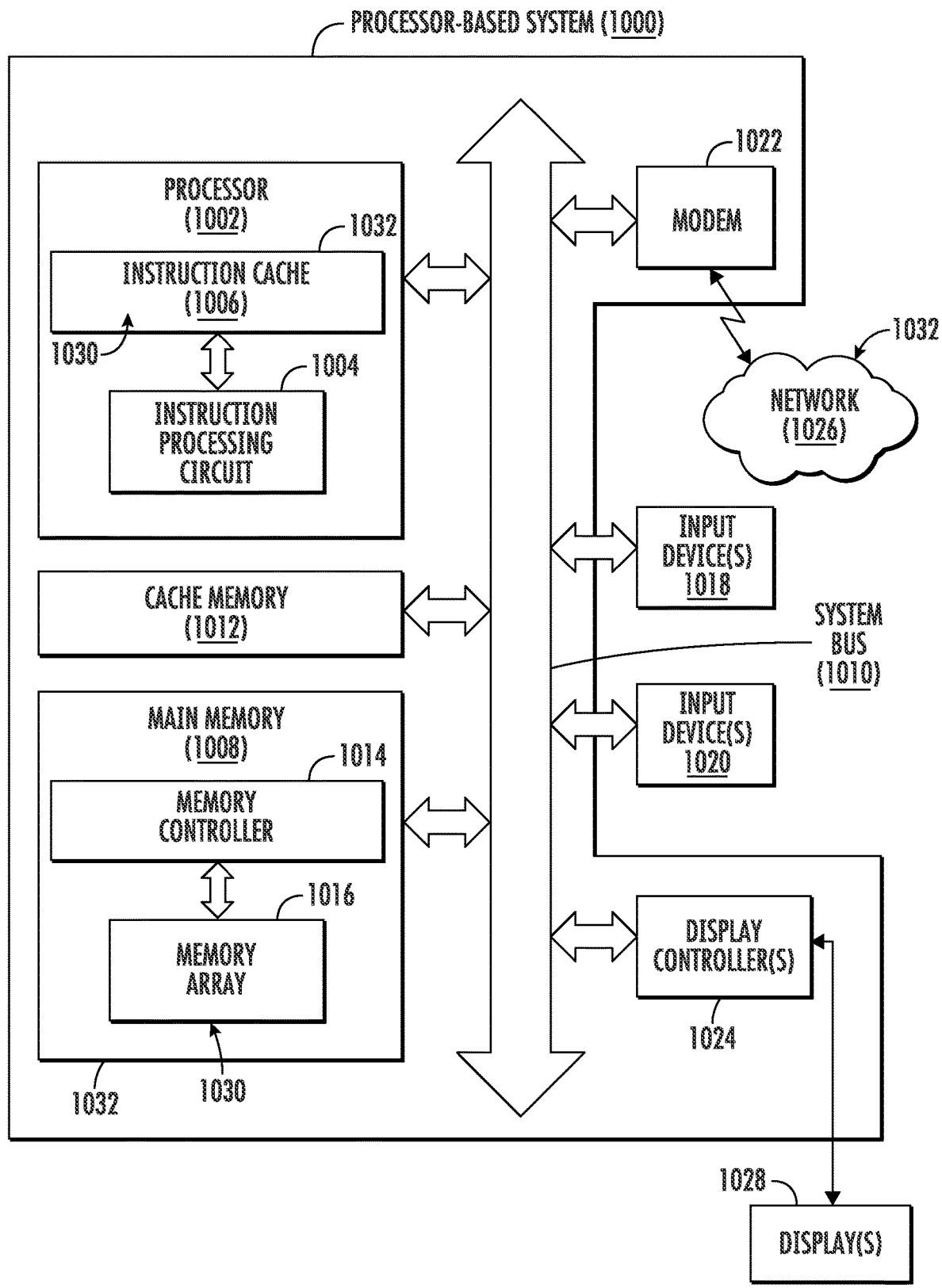

FIG. 9A is a schematic diagram providing details of the delay circuit in FIG. 7, and FIG. 9B is a timing diagram illustrating operation of the delay circuit; and FIG. 10 is a block diagram of an exemplary processor-based system including a plurality of devices coupled together through a system bus, wherein one or more integrated circuits (ICs) in the processor-based system include a PLL with a DCO and an exemplary adaptive TDC circuit for increased accuracy.

DETAILED DESCRIPTION

With reference to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Exemplary aspects disclosed herein include a time-to-digital converter (TDC) circuit with self-adaptive time granularity. Related methods of converting time to a digital value are also disclosed. A digitally controlled oscillator (DCO) in a phase-locked loop (PLL) generates periodic signal whose phase and frequency are controlled by digital signals. A TDC circuit generates a digital output indicating a time, known as a phase difference, from a phase of the generated signal to a corresponding phase of a reference signal. The digital output is used by the DCO to correct for the phase difference to synchronize the generated signal with the reference signal. In an aspect, an adaptive TDC circuit generates a first digital indication in a coarse mode when the offset time is above a threshold and generates a second digital indication in a fine mode when the offset time is below the threshold. The first digital indication and the second digital indication each comprise a same number of bits, and the first digital indication is normalized to the second digital indication for the digital output of the adaptive TDC circuit. In some examples, a fractional bit may be employed in the fine mode to modify the digital output of the adaptive TDC circuit to compensate for a quantization error for greater accuracy. In this manner, the adaptive TDC circuit can correct for a large initial phase difference and also provide high accuracy with a reduced amount of circuitry. In some examples, the adaptive TDC circuit switches from the coarse mode to the fine mode in response to the time period being less than the threshold.

Figure 1:
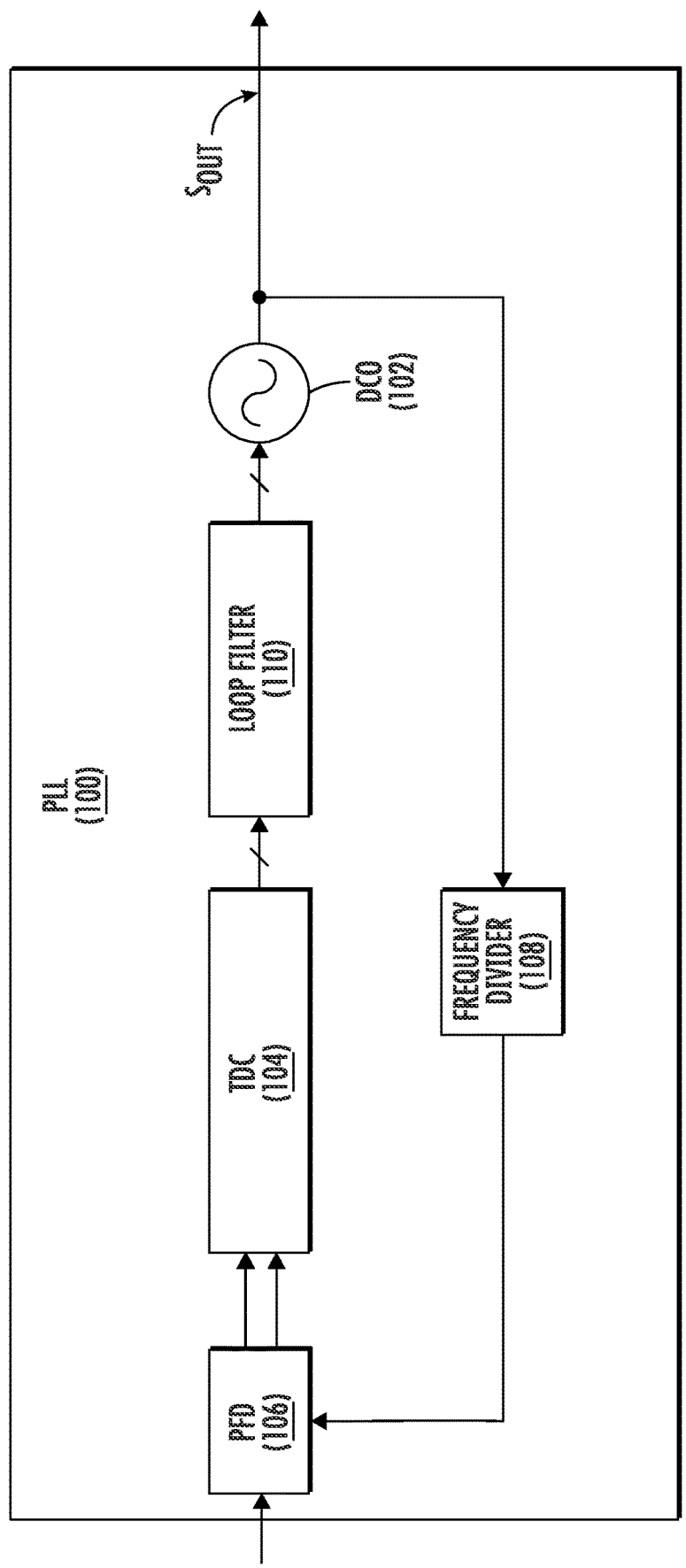
FIG. 1 is a block diagram of a conventional phase-locked-loop (PLL) with a digitally controlled oscillator (DCO) and a time-to-digital converter (TDC)

Before describing details and operation of the exemplary adaptive TDC circuits 200 and 400 in FIGS. 2 and 4, respectively, a phase-locked loop (PLL) 100, including a digitally controlled oscillator (DCO) 102 controlled by a TDC circuit 104, is described with reference to FIG. 1. The PLL 100 includes a phase and frequency detector (PFD) 106 that receives a reference signal SREF and a feedback signal SFB. The feedback signal SFB is based on an output signal $S_{OUT}$ generated by the DCO 102. The feedback signal SFB may be provided directly to the PFD 106 or first provided to a frequency divider 108 to reduce the frequency of the feedback signal SFB for processing. The PFD 106 compares the feedback signal SFB to the reference signal SREF. Specifically, the PFD 106 determines a time period, also referred to as a phase difference, between a phase of the feedback signal SFB and a phase of the reference signal SREF. The PFD 106 indicates this time period to the TDC circuit 104 as a time difference between a transition of a start signal START and a transition of a stop signal STOP. The PFD 106 may also provide a sign indicating whether the feedback signal SFB leads or lags behind the reference signal SREF by the time period. The TDC circuit 104 generates a digital output to indicate the time period detected between the start signal START and the stop signal STOP. The digital value is first provided to a loop filter 110 and then to the DCO 102 to adjust the generated signal SOUT to reduce the phase difference between the feedback signal SFB and the reference signal SREF.

When the PLL 100 is first turned on or reset, there may be a phase difference of up to nearly a full period of a cycle between the feedback signal SFB and the reference signal SREF, which the TDC circuit 104 needs to handle. On the other hand, once the phase difference has been significantly reduced, the TDC circuit 104 needs to detect small phase differences for high accuracy. However, handling large phase differences and also generating a digital output with a fine granularity can require a large amount of circuitry.

Figure 2:
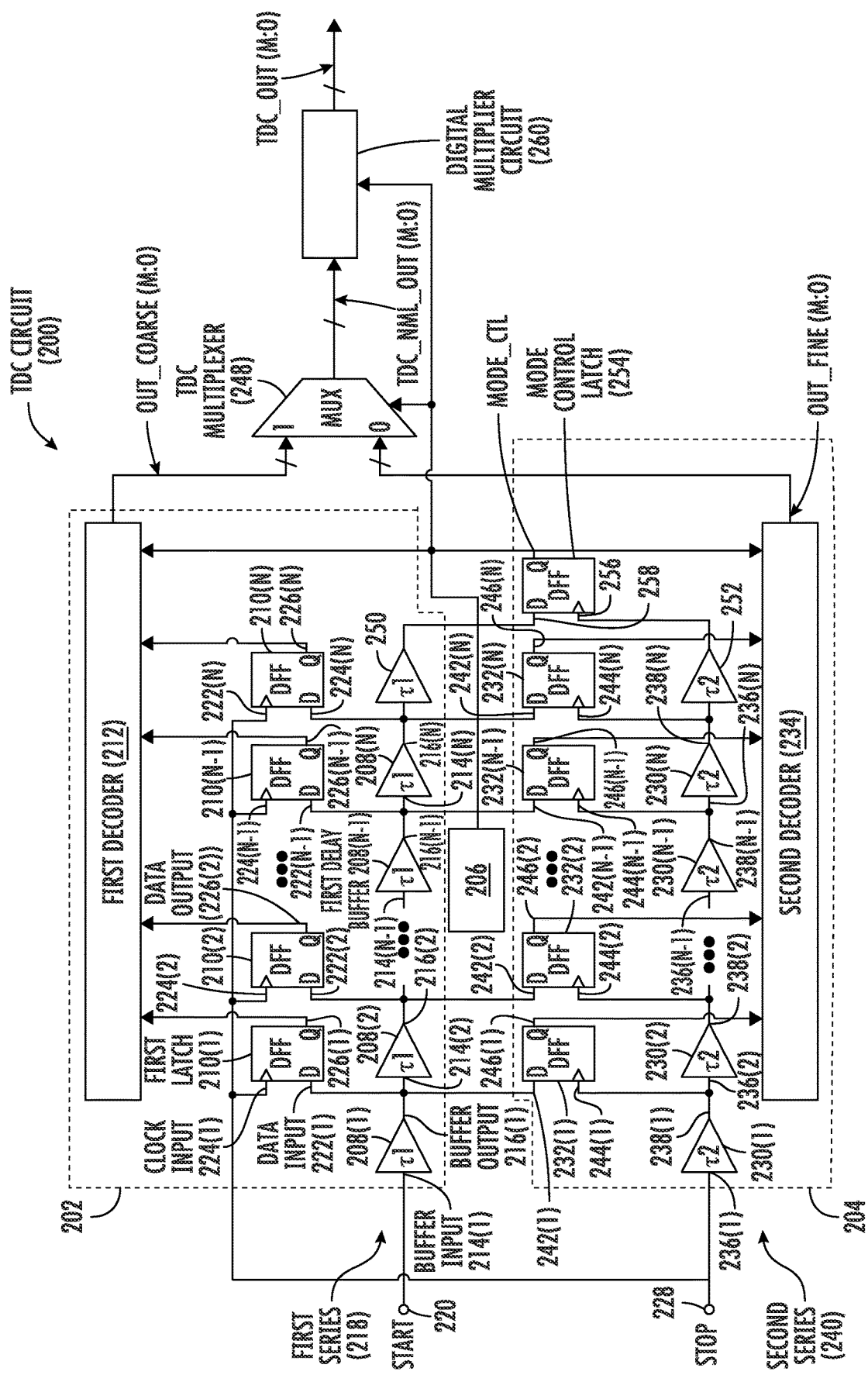
FIG. 2 is a schematic diagram of an exemplary adaptive TDC circuit, including a first TDC circuit for a coarse mode of operation and a second TDC circuit for a fine mode.

The exemplary adaptive TDC circuit 200 ("TDC circuit 200") in FIG. 2 includes a first TDC circuit 202 for a coarse mode of operation and a second TDC circuit 204 for a fine mode of operation. The coarse mode of operation is employed when a time interval TI from a start signal START to a stop signal STOP may have a broader range of values, and the fine mode of operation is employed when the time periods are within a narrower range. The adaptive TDC circuit 200 also includes control circuit 206 to control which of the first TDC circuit 202 and the second TDC circuit 204 is activated and provided as an adaptive TDC output TDC_OUT_ADP(m+1:0) to the DCO 102 in FIG. 1. The control circuit 206 may control the TDC circuit 200 to automatically switch from the coarse mode to the fine mode. The first TDC circuit 202 may initially be employed after startup or after a reset of the TDC circuit 200. In this case, the feedback signal SFB may be up to 180 degrees out of phase with the reference signal SREF. Therefore, the range of the time interval TI may be up to half (½) the period of the cycle of the reference signal SREF.

In response to the adaptive TDC output TDC_OUT_ADP (m+1:0), the phase difference between the feedback signal SFB and the reference signal SREF is reduced such that the time interval TI is within the narrower range, and the second TDC circuit 204 can be employed. In some cases, the control circuit 206 switches from the coarse mode to the fine mode when the time period between the start signal START and the stop signal STOP is below a threshold. This threshold may be a point at which a range of operation of the first TDC circuit 202 overlaps with a range of operation of the second TDC circuit 204 to provide a smooth transition.

The first TDC circuit 202 operates in a larger range of time periods indicated by a first digital indication OUT_COARSE (m:0). For example, a first digital indication OUT_COARSE (m:0) may have up to $2^4=16$ possible values, where m=3. In this example, each value of the first digital indication OUT_COARSE (m:0) can have a granularity of one thirty-second (1/32) (i.e., 1/16 of 1/2) of the entire period of a cycle of the reference signal SREF. Since the smallest time period that can be indicated by the first TDC circuit 202 would be 1/32 of the cycle, the narrower range of the second TDC circuit 204 would need to extend up to or beyond 1/32 of the cycle to overlap with the range of the first TDC circuit 202, for a smooth transition from the coarse mode to the fine mode. Once the time interval TI is reduced to the narrower range, the control circuit 206 may detect that the time interval TI has reached the threshold and switch the TDC circuit 200 from the coarse mode to the fine mode.

The second TDC circuit 204 operates in a smaller range of time periods that are indicated by a second digital indication OUT_FINE (m:0). Continuing the above example, in which m=3, each of the $2^4=16$ possible values of the second digital indication OUT_FINE (m:0) would be 1/16 of the narrower range (e.g., 1/32 of the period of the cycle), which is a granularity of 1/512 of the cycle period. The above-described ranges and value of "m" are only examples, and the disclosed TDC circuit 200 is not intended to be limited in this regard.

The granularity of the digital indications OUT_COARSE (m:0) and OUT_FINE (m:0) depend on the ranges of time periods in which they are intended to operate and on the value of "m" (i.e., their bit widths). Achieving a finer granularity by increasing "m" increases the amount of circuitry in the TDC circuit 200, which increases product cost and power consumption. On the other hand, a larger granularity causes updates to the digital output of the TDC circuit 200 to be less frequent and greater in magnitude, which produces noise in the adaptive TDC output TDC_OUT_ADP(m+1:0).

Returning to the TDC circuit 200 in FIG. 2, the first TDC circuit 202 includes a first plurality of delay buffers 208(1)-208(N) ("first delay buffers 208(1)-208(N)") and a first plurality of latches 210(1)-210(N) ("first latches 210(0)-210(N)"). The first TDC circuit 202 also includes a first decoder circuit 212.

The first delay buffers 208(1)-208(N) have buffer inputs 214(1)-214(N) and buffer outputs 216(1)-216(N). The first delay buffers 208(1)-208(N) are coupled in a first series 218 with the buffer outputs 216(1)-216(N−1) of a previous one of the first delay buffers 208(1)-208(N−1) coupled to the buffer inputs 214(2)-214(N) of a next one of the first delay buffers 208(2)-208(N). The buffer input 214(1) of the first one of the first delay buffers 208(1) in the first series 218 is coupled to a start input 220 that receives the start signal START.

The first latches 210(1)-210(N) include data inputs 222(1)-222(N), clock inputs 224(1)-224(N), and data outputs 226(1)-226(N). The data inputs 222(1)-222(N) are each coupled to one of the buffer outputs 216(1)-216(N) of a corresponding one of the first delay buffers 208(1)-208(N) in the first series 218. The clock inputs 224(1)-224(N) are coupled to a stop input 228 that receives the stop signal STOP.

Operation of the first TDC circuit 202 is explained by way of an example in which the start signal START transitions from binary "0" (e.g., ground voltage) to binary "1" (e.g., power supply voltage), the "1" propagates through the first series 218. Each of the first delay buffers 208(1)-208(N) has a same delay ti, which is a signal propagation delay from the buffer input 214(1) to the buffer output 216(1), for example. Thus, in response to a transition of the stop signal STOP, the first latches 210(1)-210(N) capture a state of the buffer outputs 216(1)-216(N) the number of first delay buffers 208(1)-208(N) that the start signal START has propagated through during the time interval TI from the start signal START to the stop signal STOP. For example, if a first time interval TI1 from the transition of the start signal START to the transition of the stop signal STOP is more than three (3) times τ1, but less than four (4) times τ1, the "1" level of the start signal START will have propagated through the first delay buffers 208(1)-208(3), but not through the first delay buffer 208(4). In this case, the first latches 210(1)-210(3) will be set to "1," and the first latches 210(4)-210(N) will be set to "0" in response to the transition of the stop signal STOP. The decoder circuit 212 is coupled to the data outputs 226(1)-226(N) of the first latches 210(1)-210(N) and encodes the states of the first latches 210(1)-210(N) to generate the first digital indication OUT_COARSE(m:0), where (m=log 2(N)−1).

The second TDC circuit 204 includes a second delay buffer 230(1)-230(N) ("second delay buffers 230(1)-230(N)") and a second plurality of latches 232(1)-232(N) ("second latches 232(1)-232(N)"). The second TDC circuit 204 also includes a second decoder circuit 234. The second delay buffers 230(1)-230(N) have buffer inputs 236(1)-236(N) and buffer outputs 238(1)-238(N). The second delay buffers 230(1)-230(N) are coupled in a second series 240 with the buffer input 236(1) of the first one of the second delay buffers 230(1) in the second series 240 coupled to the stop input 228 to receive the stop signal STOP.

The second latches 232(1)-232(N) include data inputs 242(1)-242(N), clock inputs 244(1)-244(N), and data outputs 246(1)-246(N). The data inputs 242(1)-242(N) are each coupled to one of the buffer outputs 216(1)-216(N) of a corresponding one of the first delay buffers 208(1)-208(N) in the first series 218. The clock inputs 244(1)-244(N) are each coupled to a corresponding one of the buffer outputs 238(1)-238(N) of the second delay buffers 230(1)-230(N).

In the second TDC circuit 204, each of the second delay buffers 230(1)-230(N) has a same delay τ2. The delay τ2 of each of the second delay buffers 230(1)-230(N) is less than the delay τ1 of each of the first delay buffers 208(1)-208(N). Thus, the stop signal STOP propagates through the second delay buffers 230(1)-230(N) more quickly than the start signal START propagates through the first delay buffers 208(1)-208(N). Thus, the second latches 232(1)-232(X) will be set to "1" where the start signal START has propagated through the number "X" of the first delay buffers 208(1)-208(X) before the stop signal STOP has propagated through the same number "X" of the second delay buffers 230(1)-230(X). This point may also be thought of as the point at which the stop signal STOP propagating through the series 240 "catches up" to the start signal START propagating through the series 218. The second latches 232(X+1)-232(N)

after this point will be set to "0" because the stop signal STOP continues to propagate more quickly through the second delay buffers 230(X+1)-230(N) than the start signal START propagates through the first delay buffers 208(X+1)-208(N).

If the phase difference between the start signal START and the stop signal STOP is greater than the fine granularity of the second TDC circuit 204, the stop signal STOP will not catch up to the start signal START at the second latch 232(N). This condition may be detected using a first mode buffer 250, a second mode buffer 252, and a mode control latch 254. If the stop signal STOP propagates through the second mode buffer 252 to a clock input 256 before the start signal START propagates through the first mode buffer 252 to the data input 258, the mode control latch 254 will be reset (e.g., to a low state or 0 volts). If the start signal START reaches the data input 258 before the stop signal STOP reaches the clock input 256, the mode control latch 254 will be set (e.g., to a high state or $V_{DD}$). A mode control signal MODE_CTL output from the mode control latch 254 indicates whether the TDC circuit 200 is in the fine mode or the coarse mode. Thus, the TDC circuit 200 may automatically switch from the fine mode to the coarse mode or from the coarse mode to the fine mode based on the state of the mode control latch 254.

Figure 3:
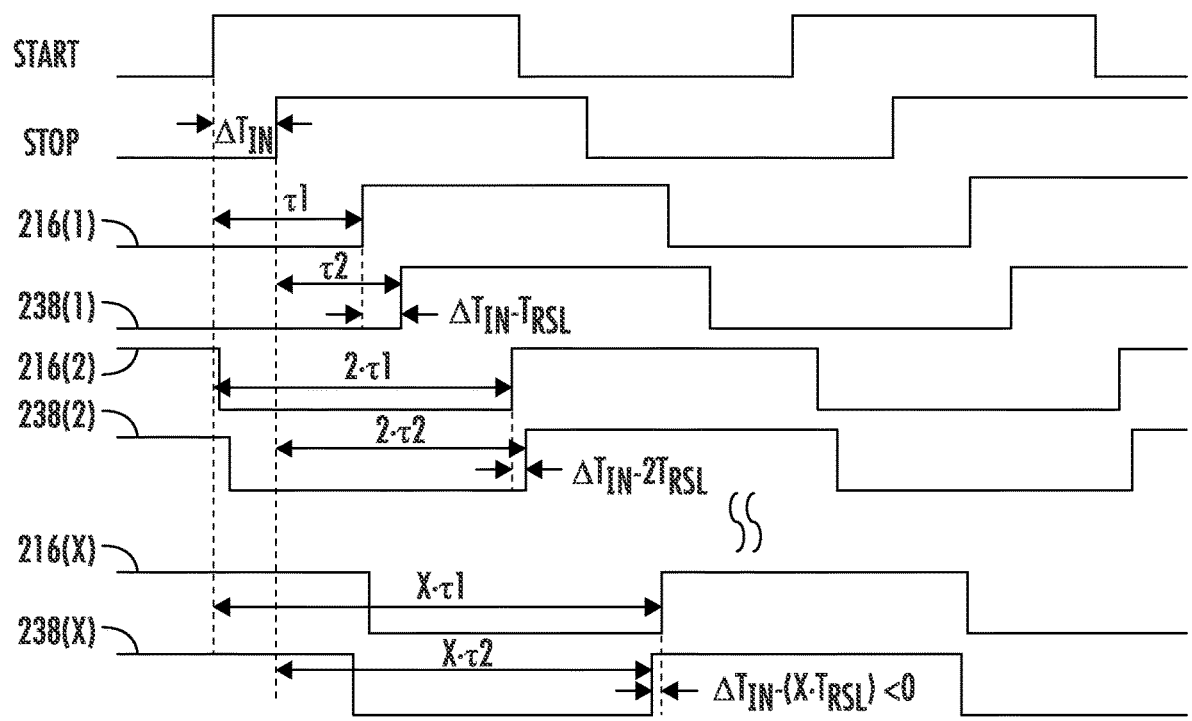
FIG. 3 is a timing diagram of start and stop signals at propagation points in the second TDC circuit in FIG. 2.

Operation of the second TDC circuit 204 may be more easily understood in view of the timing diagram in FIG. 3. FIG. 3 illustrates a transition of the start signal START at the start input 220 and a transition of the stop signal STOP at the stop input 228, separated by a time $\Delta T_{IN}$. FIG. 3 also shows the start signal START at the buffer outputs 216(1)-216(X) and the stop signal STOP at the buffer outputs 238(1)-238(X). As seen in FIG. 3, the stop signal STOP reaches the buffer output 238(X) before the start signal START reaches the buffer output 216(X). The time between the stop signal STOP reaching the buffer output 238(X) and the start signal START reaching the buffer output 216(X) is a residual time $T_{RES}=\Delta T_{IN}(X \cdot T_{RSL})$, where $T_{RSL}$ is a resolution of the second TDC circuit 204 equal to τ1−τ2.

With further reference to FIG. 2, the second decoder circuit 234 is coupled to the data outputs 246(1)-246(N) of the second latches 232(1)-232(N), and the second decoder circuit 234 encodes the states of the second latches 232(1)-232(N) to generate the second digital indication OUT_FINE(m:0). The TDC circuit 200 includes a TDC multiplexer 248 that may be controlled by the control circuit 206 to generate a selected digital output TDC_OUT(m:0), which is the first digital indication OUT_COARSE(m:0) in the coarse mode or the second digital indication OUT_FINE(m:0) in the fine mode.

In the example of the first TDC circuit 202 above, the first latches 210(1)-210(3) were set to "1," and the first latches 210(4)-210(N) were set to "0" based on the time interval TI1 between the start signal START and the stop signal STOP of more than 3 times the delay τ1 and less than 4 times the delay τ1. Thus, the delay τ1 in this example determines the granularity corresponding to the first digital indication OUT_COARSE(m:0), which is 1/32 of the cycle period of the reference signal SREF.

In a corresponding example of the second TDC circuit 204, the second latches 232(1)-232(3) being set to "1" and the second latches 232(4)-232(N) set to "0" indicates a time interval TI2 in a range between three (3) and four (4) times the difference between the delay τ1 of the first delay buffers 208(1)-208(N) and the delay τ2 of the second delay buffers 230(1)-230(N). Stated simply, the time interval TI2 is in a range of 3(τ1−τ2) to 4(τ1−τ2).

The first digital indication OUT_COARSE(m:0) for the first time interval TI1 and the second digital indication OUT_FINE(m:0) for the second time interval TI2 in the above examples would have a same digital value but would indicate different time intervals TI1 and TI2. Thus, the selected digital output TDC_OUT(m:0) generated by the TDC multiplexer 248 would have a same digital value for the time interval TI1 in the coarse mode and the time interval TI2 in the fine mode.

To resolve this difference, the TDC circuit 200 also includes a digital multiplier circuit 260 that receives the selected digital output TDC_OUT(m:0) from the TDC multiplexer 248 and generates a normalized digital output TDC_NML_OUT(m:0). In the coarse mode, the selected digital output TDC_OUT(m:0) is the first digital output OUT_COARSE(m:0). In the fine mode, the selected digital output TDC_OUT(m:0) is the second digital output OUT_FINE(m:0). The DCO 102 is configured to receive the normalized digital output TDC_NML_OUT(m:0), having the finer granularity of the second digital output OUT_FINE(m:0). Thus, in the coarse mode, the first digital output OUT_COARSE(m:0) is multiplied by a gain value, and a normalized digital output TDC_NML_OUT(m:0) is generated comprising a product of the multiplication. The gain value is selected so that each bit in the normalized digital output TDC_NML_OUT(m:0) has a same significance in the DCO 102 in the coarse mode and the fine mode. In the example described above, the first TDC circuit 202 has a range that is 16 times the range of the second TDC circuit 204. Accordingly, the digital multiplier circuit 260 multiplies the first digital output OUT_COARSE(m:0) by a gain value of 16 and generates the normalized digital output TDC_NML_OUT(m:0) from the product of the multiplication. Digital multiplication may include bit-shifting the first digital output OUT_COARSE(m:0) and adding leading with 0s (e.g., 4 bits) in the lower bits. In the fine mode, the second digital output OUT_FINE(m:0) is passed without modification to produce the normalized digital output TDC_NML_OUT(m:0). As an alternative to providing the digital multiplier circuit 260, the DCO 102 could be notified that the TDC circuit 200 is in the fine mode or the coarse mode.

Figure 4:
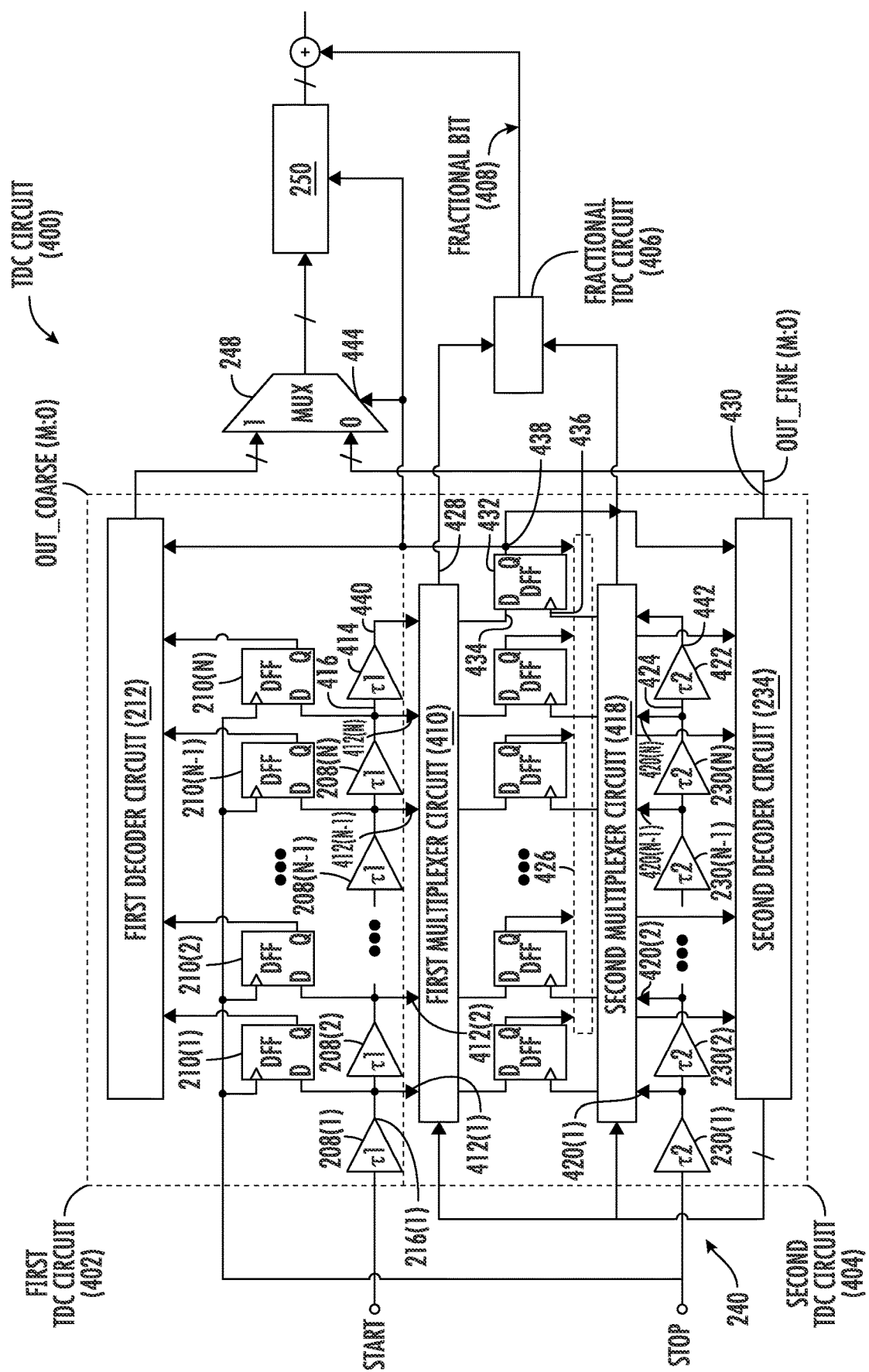
FIG. 4 is a schematic diagram of an adaptive TDC circuit, including the TDC circuit in FIG. 2 and further including a fractional TDC circuit for quantization error compensation.

FIG. 4 is an illustration of an exemplary adaptive TDC circuit 400 ("TDC circuit 400"), including a first TDC circuit 402 for coarse mode and a second TDC circuit 404 for fine mode, and also including a fractional TDC circuit 406 for quantization error compensation. The first TDC circuit 402 and the second TDC circuit 404 correspond to the first TDC circuit 202 and the second TDC circuit 204 in FIG. 2, the structure and operation of which have been discussed in detail above. Therefore, the first TDC circuit 402 and the second TDC circuit 404 are not discussed further except with regard to the fractional TDC circuit 406.

The operation of the fractional TDC circuit 406 is explained with reference to the example above, in which the time interval TI2 is between 3 times and 4 times the difference between τ1 and τ2. Due to the fine granularity of the second TDC circuit 204, there is a residual time $T_{RES}$ between a time indicated by the second digital indication OUT_FINE(m:0) (e.g., 3(τ1−τ2)) and the actual length of the second time interval TI2. Since the second digital indication OUT_FINE(m:0) will not increment from an indication of "3" to an indication of "4" unless the time interval TI2 actually reaches 4(τ1−τ2), the residual time $T_{RES}$ may be any amount less than (τ1−τ2). The residual time $T_{RES}$ is an amount that may not be measured by the second TDC circuit 404 due to the finite granularity of the second digital indication OUT_FINE(m:0). The residual time $T_{RES}$ can be referred to as a quantization error. Because the residual time $T_{RES}$ is discarded, the second digital indication OUT_FINE(m:0) consistently indicates less time than the actual time interval TI2 from the start signal START to the stop signal STOP. Stated differently, the second digital indication OUT_FINE(m:0) is, on average, consistently offset from the actual time interval TI2, which creates a persistent inaccuracy in the TDC circuit 404. The fractional TDC circuit 406 determines the residual time $T_{RES}$ as a difference between the second digital indication OUT_FINE (m:0) and the second time interval TI2.

The quantization error of a previous cycle can be used in a next cycle to improve the accuracy of the TDC circuit 400 by the 1st-order delta-sigma fashion. Compensating for the quantization error of a previous cycle may include appending a least-significant bit or fractional bit 408 to the normalized digital output TDC_NML_OUT(m:0) to generate the adaptive TDC output TDC_OUT_ADP(m+1:0).

The fractional bit 408 is set to "0" in the coarse mode, leaving the adaptive TDC output TDC_OUT_ADP(m+1:0) unchanged. The fractional bit 408 may also be set to "0" during the fine mode at times when the fractional TDC circuit 406 is disabled. However, when the fractional TDC circuit 406 is enabled, in the first mode, the fractional bit 408 is set to either a "0" or a "1" in a first cycle depending on the residual time $T_{RES}$ in the first cycle and a quantization error of the previous cycle. As a result, the adaptive TDC output TDC_OUT_ADP(m+1:0) will indicate, in some cases, a time that is slightly less than the actual time interval TI2 and, in some cases, will indicate a time that is slightly greater than the time interval TI2. Thus, on average, the phase difference between the feedback signal SFB and the reference signal SREF is reduced with the fractional TDC circuit 406 being active compared to the fractional TDC circuit 406 being inactive.

Referring again to FIG. 4, the TDC circuit 400 includes a first multiplexer circuit 410, including a plurality of inputs 412(1)-412(N), each coupled to a corresponding one of the buffer outputs 216(1)-216(N) of the first delay buffers 208 (1)-208(N) and a start delay buffer 414. The start delay buffer 414 includes a buffer input 416 coupled to the buffer output 216(N) of the first delay buffer 208(N) in the first series 218. The TDC circuit 400 includes a second multiplexer circuit 418, including a plurality of inputs 420, each coupled to one of the buffer outputs 238(1)-238(N) of the second delay buffers 230(0) and to a stop delay buffer 422. The stop delay buffer 422 includes a buffer input 424 coupled to the buffer output 216(N) of a second delay buffer 230(N) in the second series 240.

The TDC circuit 400 also includes a multiplexer control circuit 426 coupled to the data outputs 246(1)-246(N) of the second latches 232(1)-232(N) to detect the point at which the stop signal STOP has propagated through a number "X" of the second delay buffers 230(0)-230(N) and the start signal START has propagated through a same number "X" of the first delay buffers 208(1)-208(N). The multiplexer control circuit 426 controls the first multiplexer circuit 410 to couple the buffer output 216(X) of the first delay buffer 208(X) to a first multiplexer circuit output 428 and controls the second multiplexer circuit 418 to coupled the buffer output 216 of the second delay buffer 230(X) to a second multiplexer circuit output 430. The first multiplexer circuit output 428 and the second multiplexer circuit output 430 are coupled to the fractional TDC circuit 406, which receives the start signal START from the first multiplexer circuit output 428 and receives the stop signal STOP from the second multiplexer circuit output 430. The fractional TDC circuit 406 determines the residual time $T_{RES}$ between the start signal START and the stop signal STOP.

The TDC circuit 400 also includes a mode control latch 432 comprising a data input 434, a clock input 436, and a data output 438. The data input 434 is coupled to a buffer output 440 of the start delay buffer 414. The clock input 436 is coupled to a buffer output 442 of the stop delay buffer 422, and the data output 438 is coupled to a control input 444 of the TDC multiplexer 248. The data output 438 of the mode control latch 432 is set to a "0" if a time interval TI3 from the start signal START to the stop signal STOP is less than a threshold. The data output 438 of the mode control latch 432 is set to a "1" if a time interval TI3 from the start signal START to the stop signal STOP is more than the threshold. The data output 438 of the mode control latch 432 indicates whether the TDC circuit 400 is in coarse mode or fine mode. Providing a "0" to the control input 444 of the TDC multiplexer 248 may switch the TDC circuit 400 into the fine mode.

Figure 5A:
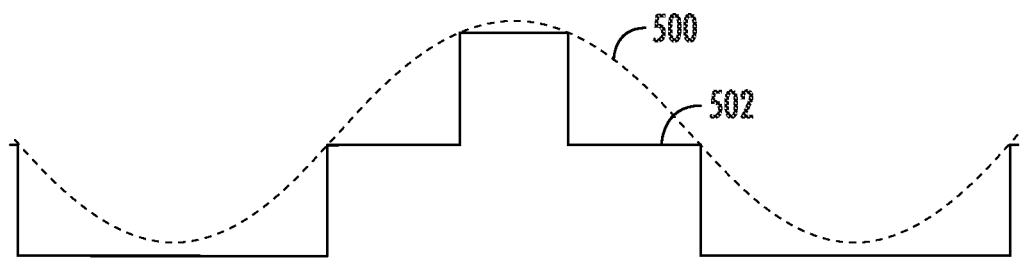
FIGS. 5A-5C are illustrations of a reference signal and digital outputs of a TDC in a coarse mode, in a fine mode, and with compensation for quantization errors.
Figure 5B:
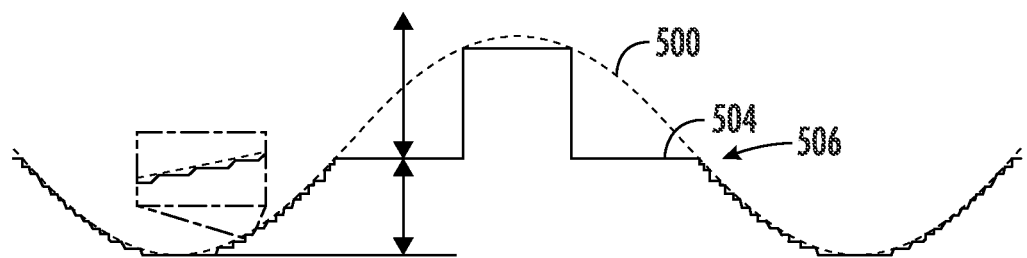
Figure 5C:
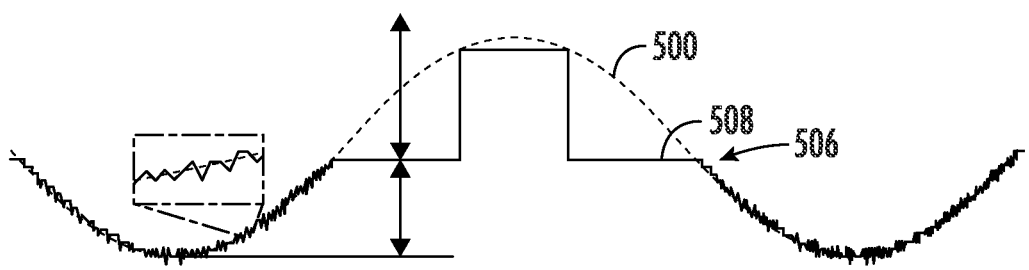

FIGS. 5A-5C are illustrations of the reference signal SREF and the feedback signal SFB based on digital outputs of the adaptive TDC circuit 400 in a coarse mode, in a fine mode, and with compensation for quantization errors activated in the fine mode.

Each of FIGS. 5A-5C show an ideal time continuously varying phase difference 500 between a feedback signal SFB generated by the DCO 102 and the reference signal SREF through a cycle of oscillation. FIGS. 5A-5C respectively show digital outputs having different granularities that may be generated in TDC circuits in response to the phase difference 500.

FIG. 5A shows an example of a digital output 502 of a hypothetical standalone delay-line TDC circuit including only the function of the first TDC circuit 402. In this case, the digital output 502 suffers a large quantization noise as the input time interval changes.

FIG. 5B shows a TDC output 504, which may correspond to the adaptive TDC digital output TDC_OUT_ADP(m:0) of the TDC circuit 200 or the TDC_OUT_ADP(m+1:0) of the TDC circuit 400 with the fractional TDC circuit 406 turned off. The TDC output 504 is based on the second TDC circuit 404, in which the residual time $T_{RES}$ is discarded every cycle. As a result, the TDC output 504 is based on a phase difference that is equal to or less than the phase difference 500. When a time interval TIS between the feedback signal SFB and the reference signal SREF is greater than the threshold 506, the TDC output 504 is generated by the first TDC circuit 402 with the coarse granularity. When the time interval TIS is less than the threshold 506, the TDC output 504 is generated by the second TDC circuit 404 with a finer granularity than the TDC output 504 in FIG. 5A. Because the residual time $T_{RES}$ is discarded and not included in the generation of the TDC_OUT_ADP(m:0), the TDC output 504 is, on average, consistently offset from phase difference 500.

FIG. 5C shows a TDC output 508, which may correspond to the adaptive TDC digital output TDC_OUT_ADP(m+1:0) of the TDC circuit 400 with the fractional TDC circuit 406 turned on to include the fractional bit 408. When the time interval TI between the feedback signal SFB and the reference signal SREF is greater than the threshold 506, the TDC output 508 is generated by the first TDC circuit 402 with coarse granularity. When the time interval TI is below the threshold 506, the second TDC circuit 404 is employed. Due to the addition of the fractional bit 408, based on the residual time $T_{RES}$ and the quantization error, the TDC output 508 indicates a time interval TI– that is slightly less than the actual time interval TI2 in some cycles and a time interval TI+ that is slightly greater than the time interval TI2 in other cycles. Thus, on average, the adaptive TDC output 508 in FIG. 5C is more accurate due to the fractional TDC circuit 406 being active than the TDC output 504 in FIG. 5B, which is not generated by the fractional TDC circuit 406.

Figure 6:
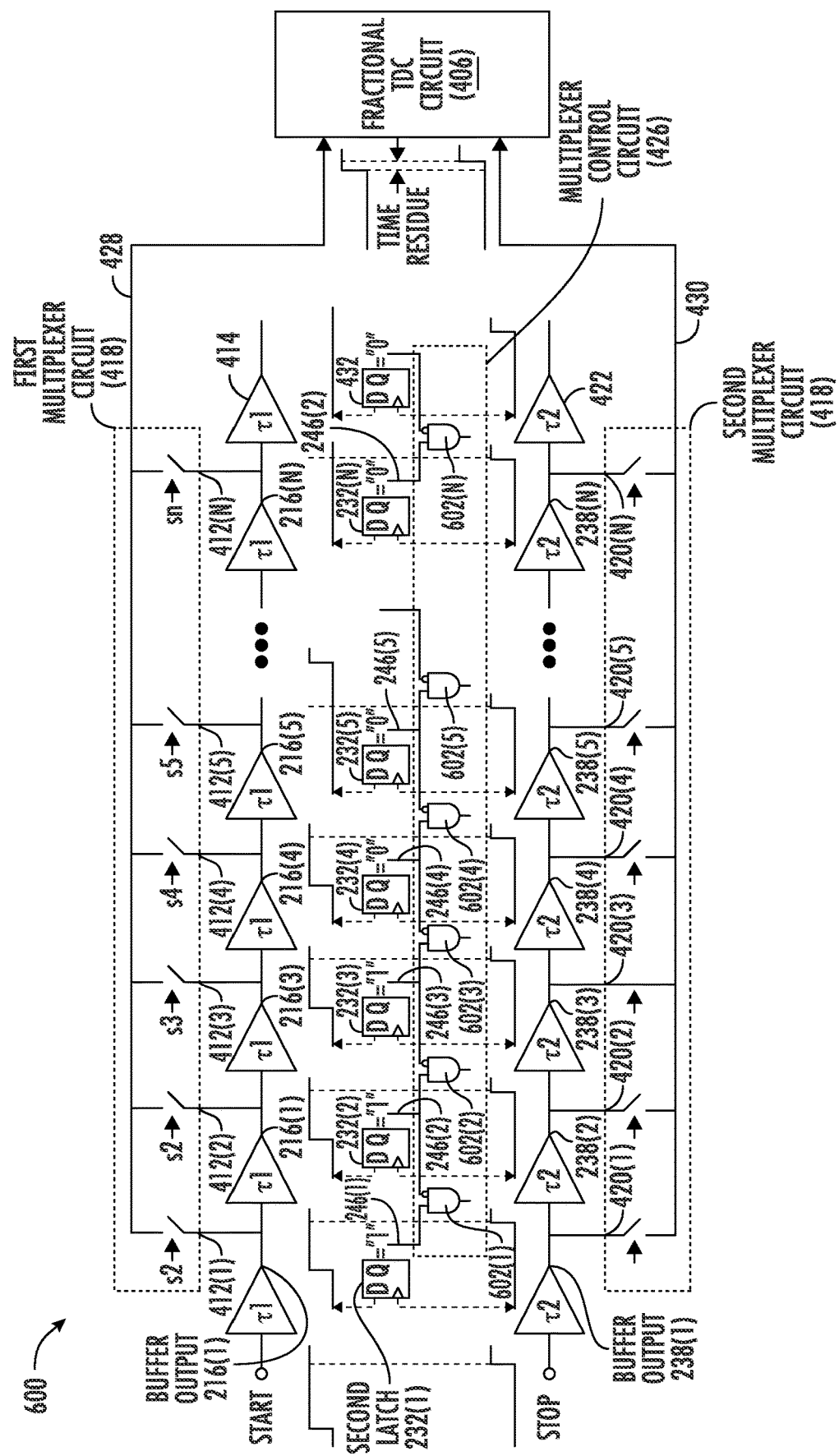
FIG. 6 is a schematic diagram of multiplexer circuits and a multiplexer controller circuit for providing an indication of a residual time of the second TDC circuit in FIG. 2 to a fractional TDC circuit.

FIG. 6 is a schematic diagram 600 of the first multiplexer circuit 410, the second multiplexer circuit 418, the multiplexer control circuit 426, and the fractional TDC circuit 406. FIG. 6 shows the plurality of inputs 412(1)-412(N) of the first multiplexer circuit 410 coupled to the buffer outputs 216(1)-216(N) of the first delay buffers 208(1)-208(N) and the plurality of inputs 420(1)-420(N) of the second multiplexer circuit 418 coupled to the buffer outputs 238(1)-238(N) of the second delay buffers 230(1)-230(N). The first multiplexer circuit output 428 and the second multiplexer circuit output 430 are coupled to the fractional TDC circuit 406.

The multiplexer control circuit 426 in the example shown in FIG. 6 includes a plurality of gate circuits 602(1)-602(N) coupled to the data outputs 246(1)-246(N) of the second latches 232(1)-232(N) and to the mode control latch 432. Specifically, the gate circuit 602(1) is coupled to the data outputs 246(1) and 246(2) of the second latches 232(1) and 232(2), the gate circuit 602(N−1) is coupled to the data outputs 246(N−1) and 246(N) of the second latches 232(N−1) and 232(N), the gate circuit 602(N) is coupled to the data outputs 246(N) of the second latch 232(N), and to the mode control latch 432, and the gate circuit 602(2) is coupled to the data outputs 246(2) and to the data output 438 of the mode control latch 432. As an example, the gate circuit 602(3) detects that the stop signal STOP has caught up to the start signal START at the second latch 232(3) because the second latch 232(3) is set to "1" and the second latch 232(4) is set to "0". The second latch 232(4) is set to "1 because the "1" of the start signal START has propagated through the first delay buffer 208(3), and the "1" of the stop signal STOP has propagated through the second delay buffer 230(3). The second latch 232(4) is set to "0" because the "1" of the start signal START has not propagated through the first delay buffer 208(3) before the "1" of the stop signal STOP has propagated through the second delay buffer 230(3). In some examples, each of the gate circuits 602(1)-602(N) may be a combination of an AND gate and an inverter, but other logic circuits may be employed for the gate circuits 602(1)-602(N).

FIG. 7 is a schematic diagram of a fractional TDC circuit 700, which may be the fractional TDC circuit 406 in FIG. 4. The fractional TDC circuit 700 receives the start signal START from first multiplexer circuit output 428 as the delayed start signal START_DS and receives the stop signal STOP from the second multiplexer circuit output 430 as the delayed stop signal STOP_DS is coupled to the fractional TDC circuit 406 to provide a delayed stop signal STOP_DS. The second TDC circuit 404 determines that the time interval TI2 from a transition of the start signal START to a transition of the stop signal STOP is greater than $3(\tau1-\tau2)$ and less than $4(\tau1-\tau2)$. The residual time $T_{RES}$ is a portion of the time interval TI2 not measured by the second TDC circuit 404 because the residual time $T_{RES}$ is smaller than the fine granularity $(\tau1-\tau2)$ of the second TDC circuit 404. The fractional TDC circuit 700 receives an indication of the residual time $T_{RES}$ based on a separation in time between transitions of the delayed start signal START_DS and the delayed stop signal STOP_DS. As described above, the fractional TDC circuit 700 determines a quantization error as a difference between the fine granularity of the second TDC circuit 404 $(\tau1-\tau2)$ and the residual time $T_{RES}$. The fractional TDC circuit 700 generates the fractional bit 408 that is appended as a low order bit to the normalized digital output TDC_NML_OUT(m:0) to generate the adaptive TDC output TDC_OUT_ADP(m+1:0). In other words, the normalized digital output TDC_NML_OUT(m:0) becomes TDC_OUT_ADP(m+1:1) and the fractional bit 408 becomes the TDC_OUT_ADP(0). The circuit for the fractional TDC circuit 700 shown in FIG. 7 is one non-limiting example that may be employed for this function.

The fractional TDC circuit 700 includes an adder circuit 702 to receive the indication of the residual time $T_{RES}$ in a first cycle and receive a quantization error QERR of the previous cycle. The quantization error QERR is indicated to the adder circuit 702 as a time between transitions of a feedback start signal START_FB and a feedback stop signal STOP_FB. The adder circuit 702 adds the quantization error QERR to the residual time $T_{RES}$ to generate an adjusted time SUM. In some cases, the quantization error QERR may be negative, so the residual time $T_{RES}$ is reduced by the quantization error QERR. The adder circuit 702 indicates the adjusted time SUM as a time between a transition of a positive sum SUM_POS and a transition of a negative sum SUM_NEG.

The fractional TDC circuit 700 also includes a sum hold circuit 704, including hold latches 706P and 706N that are clocked by the positive sum SUM_POS and the negative sum SUM_NEG, respectively. The order of the transitions of the hold latches 706P and 706N determines whether a quantizer latch 708 in a quantization error circuit 710 is set to a first value, indicating the adjusted sum SUM is positive, or to a second value indicating the adjusted sum SUM is negative. The quantization error circuit 710 generates the quantization error QERR, which includes determining a difference between the granularity $(\tau1-\tau2)$ and the adjusted time SUM. Specifically, the quantization error circuit 710 delays the output of the hold latch 706P by each of the delays $\tau1$ and $\tau2$ and also delays the output of the hold latch 706N by each of the delays $\tau1$ and $\tau2$. Depending on whether the quantizer latch 708 indicates the adjusted sum SUM is positive or negative, multiplexer 712P selects the hold latch 706P delayed by one of the delays $\tau1$ and $\tau2$ and the multiplexer 710N selects the hold latch 706N delayed by the other one of the delays $\tau1$ and $\tau2$. By this method, the quantization error circuit 710 subtracts the adjusted sum SUM from the granularity $(\tau1-\tau2)$. The multiplexers 712P and 712N provide the quantization error QERR to an error delay circuit 714 as positive error ERR_POS and negative error ERR_NEG so the quantization error QERR can be held for use in the adder circuit 702 in the next cycle. In the next cycle, the error delay circuit 714 provides the quantization error QERR to an initialization circuit 716. The initialization circuit 716 selects one of the residual time $T_{RES}$ of the first cycle and the quantization error QERR of the previous cycle, based on an initialization signal INITIAL to be provided as the feedback start signal START_FB and the feedback stop signal STOP_FB to the adder circuit 702.

The adder circuit 702 adjusts the residual time $T_{RES}$ in a first cycle based on the quantization error QERR generated in the previous cycle to generate the adjusted time SUM. The quantizer latch 708 provides the fractional bit 408 in FIG. 4.

Figure 8A:
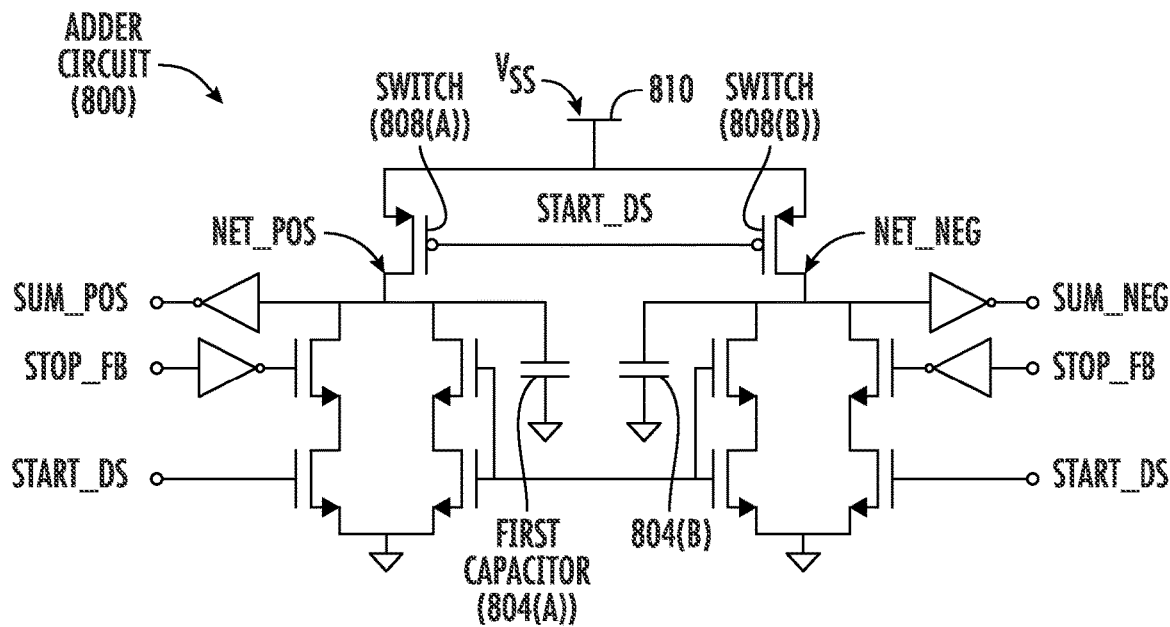
FIG. 8A is a schematic diagram providing details of the adder circuit in FIG. 7
Figure 8B:
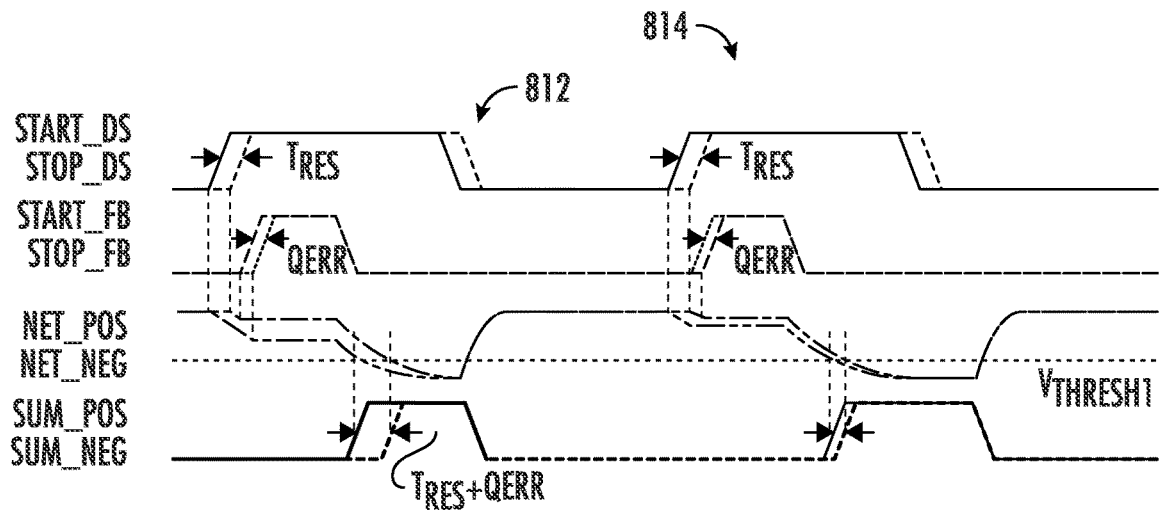
FIG. 8B is a timing diagram illustrating operation of the adder circuit.

FIG. 8A is a detailed schematic diagram of an adder circuit 800, and FIG. 8B is a timing diagram of operation of the adder circuit 800. The adder circuit 800 may be employed in the adder circuit 702 to add the residual time $T_{RES}$ from a first cycle and the quantization error QERR from a previous cycle. The adder circuit 800 receives the indication of the residual time $T_{RES}$ of the first cycle as a time difference between a transition of the delayed start signal START_DS and a transition of the delayed stop signal STOP_DS. The adder circuit 702 receives the quantization error QERR of the previous cycle as a time from a transition of the feedback start signal START_FB to a transition of the feedback stop signal STOP_FB. The quantization error QERR is added to the residual time $T_{RES}$ to generate the adjusted time SUM, which is output as a time from a transition of a positive sum SUM_POS and a transition of a negative sum SUM_NEG.

The adder circuit 800 includes a first capacitor 804(A) and a second capacitor 804(B). The adder circuit 800 indicates the adjusted sum SUM as a difference in voltage between a positive charge node NET_POS indicating a voltage of the first capacitor 804(A) and a negative charge node NET_NEG indicating a voltage of the second capacitor 804(B).

The first capacitor 804(A) and the second capacitor 804(B) are both charged to a supply voltage $V_{DD}$ while the delayed start signal START_DS is in a "low state" (e.g., 0 volts, VSS). With the delayed start signal START_DS in the low state, supply switches 808(A) and 808(B) couple the first capacitor 804(A) and the second capacitor 804(B) to a supply voltage rail 810.

The indication of the residual time $T_{RES}$ is received first as a time from the delayed start signal START_DS transitioning from the low state to a high state (e.g., $V_{DD}$) to the delayed stop signal STOP_DS transitioning from the low state to the high state. The residual time $T_{RES}$ is shown as The quantization error QERR indication is received, after the indication of the residual time $T_{RES}$, as a time between respective transitions of the feedback start signal START_FB and the feedback stop signal STOP_FB from the low state to the high state. The order of the transitions of the feedback start signal START_FB and the feedback stop signal STOP_FB indicates whether the quantization error is negative or positive.

The first capacitor 804(A) and the second capacitor 804(B) stop charging when the delayed start signal START_DS transitions from the low state to the high state ("low to high"). The second capacitor 804(B) discharges when the delayed start signal START_DS transitions from low to high and continues discharging until the feedback stop signal STOP_FB transitions from low to high. Prior to the feedback start signal START_FB transitioning from low to high, the first capacitor 804(A) begins discharging in response to the delayed stop signal STOP_DS transitioning from low to high. The first capacitor 804(A) stops discharging when the feedback start signal START_FB transitions from high to low (e.g., from a high state to a low state). Discharging the first capacitor 804(A) and the second capacitor 804(B) in this manner sets the voltage differential to indicate the adjusted sum SUM. That is, the voltage differential between the positive charge node NET_POS and the negative charge node NET_NEG corresponds to the adjusted sum SUM.

As shown in the first example 812 in FIG. 8B, the feedback start signal START_FB precedes the feedback stop signal STOP_FB when the quantization error QERR is positive. Here, the generated adjusted sum SUM is equal to the residual time $T_{RES}$ increased by the quantization error QERR. As shown in the second example 814, the feedback start signal START_FB follows the feedback stop signal STOP_FB when the quantization error QERR is negative. Thus, in the second example 814, the residual time $T_{RES}$ is reduced by the magnitude of the quantization error QERR to generate the adjusted sum SUM.

As previously noted, the voltage differential between the positive charge node NET_POS and the negative charge node NET_NEG corresponds to the adjusted sum SUM, which is provided as an output of the adder circuit 800 as the time from a transition of the positive sum SUM_POS to a transition of the negative sum SUM_NEG. The adjusted sum SUM is generated in response to the feedback start signal START_FB and the feedback stop signal STOP_FB transitioning from high to low while the delayed start signal START_DS and the delayed stop signal STOP_DS remain in the high state. As the first capacitor 804(A) discharges, the positive charge node NET_POS drops below a threshold voltage $V_{THRESH1}$, which in turn triggers the positive sum SUM_POS to transition from low to high. As the second capacitor 804(B) discharges, the negative charge indication NET_NEG drops below the threshold voltage $V_{THRESH1}$, which triggers the negative sum SUM_NEG to transition from low to high. The positive sum SUM_POS and the negative sum SUM_NEG are coupled to the sum hold circuit 704 in FIG. 7.

FIG. 9A is a detailed schematic diagram of an error delay circuit 900 and FIG. 9B is a timing diagram of operation of the error delay circuit 900. The error delay circuit 900 may be employed as the error delay circuit 714 in FIG. 7. Operation of the error delay circuit 900 is described with reference to the timing diagram in FIG. 9B. A cycle of operation of the error delay circuit 900 begins while a delayed reset signal RST_DLY is in a high state, causing a first capacitor 902(A) and a second capacitor 902(B) to be discharged. When the delayed reset signal RST_DLY drops and the positive error ERR_POS and the negative error ERR_NEG are also reset to a low state, the first capacitor 902(A) and the second capacitor 902(B) charge to the supply voltage $V_{DD}$. The quantization error QERR is indicated a time between low to high transitions of the positive error ERR_POS and the negative error ERR_NEG. The first capacitor 902(A) begins discharging in response to the positive error ERR_POS rising from a low state to a high state, and the second capacitor 902(B) begins discharging in response to the negative error ERR_NEG rising to the high state. The discharging of both of the first capacitor 902(A) and the second capacitor 902(B) stops in response to the stop error ERR_STOP, which is the positive error ERR_POS that has been delayed and inverted. A voltage of the first capacitor 902(A) is on a positive node NODE_POS and a voltage of the second capacitor 902(B) is on a negative node NODE_NEG. Thus, a voltage difference between the positive node NODE_POS and the negative node NODE_NEG is proportional to the quantization error QERR.

At the end of the cycle, the reset signal RST_DLY rises from low to high, which triggers the first capacitor 902(A) and the second capacitor 902(B) to discharge at the same rate. The quantization error QERR is indicated as a time between the positive node NODE_POS dropping to a threshold value $V_{THRESH2}$ and the negative node NODE_NEG dropping to the threshold value $V_{THRESH2}$. The quantization error QERR is provided to the initialization circuit 710 of FIG. 7 as a time difference between a positive delayed error ERR_DLY_POS and a negative delayed error ERR_DLY_NEG.

FIG. 10 is a block diagram of an exemplary processor-based system 1000 that includes a processor 1002 (e.g., a microprocessor) that includes an instruction processing circuit 1004. The processor-based system 1000 may be a circuit or circuits included in an electronic board card, such as a printed circuit board (PCB), a server, a personal computer, a desktop computer, a laptop computer, a personal digital assistant (PDA), a computing pad, a mobile device, or any other device, and may represent, for example, a server, or a user's computer. In this example, the processor-based system 1000 includes the processor 1002. The processor 1002 represents one or more general-purpose processing circuits, such as a microprocessor, central processing unit, or the like. More particularly, the processor 1002 may be an EDGE instruction set microprocessor or other processor implementing an instruction set that supports explicit consumer naming for communicating produced values resulting from execution of producer instructions. The processor 1002 is configured to execute processing logic in instructions for performing the operations and steps discussed herein. In this example, the processor 1002 includes an instruction cache 1006 for temporary, fast access memory storage of instructions accessible by the instruction processing circuit 1004. Fetched or prefetched instructions from a memory, such as a main memory 1008, over a system bus 1010, are stored in the instruction cache 1006. Data may be stored in a cache memory 1012 coupled to the system bus 1010 for low-latency access by the processor 1002. The instruction processing circuit 1004 is configured to process instructions fetched into the instruction cache 1006 and process the instructions for execution.

The processor 1002 and the main memory 1008 are coupled to the system bus 1010 and can intercouple peripheral devices included in the processor-based system 1000. As is well known, the processor 1002 communicates with these other devices by exchanging address, control, and data information over the system bus 1010. For example, the processor 1002 can communicate bus transaction requests to a memory controller 1014 in the main memory 1008 as an example of a slave device. Although not illustrated in FIG. 10, multiple system buses 1010 could be provided; wherein each system bus 1010 constitutes a different fabric. In this example, the memory controller 1014 is configured to provide memory access requests to a memory array 1016 in the main memory 1008. The memory array 1016 is comprised of an array of storage bit cells for storing data. The main memory 1008 may be a read-only memory (ROM), flash memory, dynamic random-access memory (DRAM), such as synchronous DRAM (SDRAM), etc., and/or static memory (e.g., flash memory, SRAM, etc.), as non-limiting examples.

Other devices can be connected to the system bus 1010. As illustrated in FIG. 10, these devices can include the main memory 1008, one or more input device(s) 1018, one or more output device(s) 1020, a modem 1022, and one or more display controllers 1024, as examples. The input device(s) 1018 can include any type of input device, including but not limited to input keys, switches, voice processors, etc. The output device(s) 1020 can include any type of output device, including but not limited to audio, video, other visual indicators, etc. The modem 1022 can be any device configured to allow exchange of data to and from a network 1026. The network 1026 can be any type of network, including but not limited to a wired or wireless network, a private or public network, a local area network (LAN), a wireless local area network (WLAN), a wide area network (WAN), a BLUETOOTH™ network, and the Internet. The modem 1022 can be configured to support any type of communications protocol desired. The processor 1002 may also be configured to access the display controller(s) 1024 over the system bus 1010 to control information sent to one or more displays 1028. The display(s) 1028 can include any type of display, including but not limited to a cathode ray tube (CRT), a liquid crystal display (LCD), a plasma display, etc.

The processor-based system 1000 in FIG. 10 may include a set of instructions 1030 to be executed by the processor 1002 for any application desired according to the instructions. The instructions 1030 may be stored in the main memory 1008, processor 1002, and/or instruction cache 1006 as examples of a non-transitory computer-readable medium 1032. The instructions 1030 may also reside, completely or at least partially, within the main memory 1008 and/or within the processor 1002 during their execution. The instructions 1030 may further be transmitted or received over the network 1026 via the modem 1022, such that the network 1026 includes computer-readable medium 1032.

Any of the circuits in the processor-based system 1000, and in particular the modem 1022 and the output devices 1020, may include a TDC circuit 200, as shown in FIG. 3, or a TDC circuit 400, as shown in FIG. 6 with a hold capacitor for reducing ripple in a control voltage to reduce jitter in a generated analog signal.

While the computer-readable medium 1032 is shown in an exemplary embodiment to be a single medium, the term "computer-readable medium" should be taken to include a single medium or multiple media (e.g., a centralized or distributed database and/or associated caches and servers) that store the one or more sets of instructions. The term "computer-readable medium" shall also be taken to include any medium that is capable of storing, encoding, or carrying a set of instructions for execution by the processing device and that causes the processing device to perform any one or more of the methodologies of the embodiments disclosed herein. The term "computer-readable medium" shall accordingly be taken to include, but not be limited to, solid-state memories, optical medium, and magnetic medium.

The embodiments disclosed herein include various steps. The steps of the embodiments disclosed herein may be formed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product or software that may include a machine-readable medium (or computer-readable medium) having stored thereon instructions, which may be used to program a computer system (or other electronic devices) to perform a process according to the embodiments disclosed herein. A machine-readable medium includes any mechanism for storing or transmitting information in a form readable by a machine (e.g., a computer). For example, a machine-readable medium includes a machine-readable storage medium (e.g., ROM, random access memory ("RAM"), a magnetic disk storage medium, an optical storage medium, flash memory devices, etc.); and the like.

Unless specifically stated otherwise and as apparent from the previous discussion, it is appreciated that throughout the description, discussions utilizing terms such as "processing," "computing," "determining," "displaying," or the like refer to the action and processes of a computer system, or similar electronic computing device, that manipulates and transforms data and memories represented as physical (electronic) quantities within the computer system's registers into other data similarly represented as physical quantities within the computer system memories or registers or other such information storage, transmission, or display devices.

The algorithms and displays presented herein are not inherently related to any particular computer or other apparatus. Various systems may be used with programs in accordance with the teachings herein, or it may prove convenient to construct more specialized apparatuses to perform the required method steps. The required structure for a variety of these systems will appear from the description above. In addition, the embodiments described herein are not described with reference to any particular programming language. It will be appreciated that a variety of programming languages may be used to implement the teachings of the embodiments as described herein.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The components of the distributed antenna systems described herein may be employed in any circuit, hardware component, integrated circuit (IC), or IC chip, for example. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends on the particular application, design choices, and/or design constraints imposed on the overall system. Skilled artisans may implement the described functionality in varying ways for each particular application, but such implementation decisions should not be interpreted as causing a departure from the scope of the present embodiments.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA), or other programmable logic device, a discrete gate or transistor logic, discrete hardware components, or any combination thereof designed to perform the functions described herein. Furthermore, a controller may be a processor. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The embodiments disclosed herein may be embodied in hardware and in instructions that are stored in hardware and may reside, for example, in RAM, flash memory, ROM, Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from and write information to the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. Those of skill in the art will also understand that information and signals may be represented using any of a variety of technologies and techniques. For example, data, instructions, commands, information, signals, bits, symbols, and chips that may be referenced throughout the above description may be represented by voltages, currents, electromagnetic waves, magnetic fields, optical fields or particles, or any combination thereof.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that any particular order be inferred.

It will be apparent to those skilled in the art that various modifications and variations can be made without departing from the spirit or scope of the invention. Since modifications, combinations, sub-combinations, and variations of the disclosed embodiments incorporating the spirit and substance of the invention may occur to persons skilled in the art, the invention should be construed to include everything within the scope of the appended claims and their equivalents.

What is claimed is:

1. An adaptive time-to-digital converter (TDC) circuit, comprising:
   a start input;
   a stop input;
   a first TDC circuit configured to generate a first digital measurement of a first time period from a first voltage transition of a start signal at the start input to a first voltage transition of a stop signal at the stop input;
   a second TDC circuit configured to generate a second digital measurement of a second time period, non-overlapping with the first time period, from a second voltage transition of the start signal at the start input to a second voltage transition of the stop signal at the stop input; and
   a TDC multiplexer configured to generate a selected value comprising one of the first digital measurement and the second digital measurement,
   wherein:
      the first digital measurement and the second digital measurement each comprise a same number of bits; and
      a first granularity of the first digital measurement is more coarse than a second granularity of the second digital measurement.

2. The adaptive TDC circuit of claim 1, further comprising a mode control latch configured to:
   indicate one of a coarse mode and a fine mode; and
   switch from indicating the coarse mode, in which the first TDC circuit is employed, to indicating the fine mode, in which the second TDC circuit is employed, based on the first time period being less than a threshold.

3. The adaptive TDC circuit of claim 2, further comprising a digital multiplier circuit configured to:
   in the coarse mode, receive the first digital measurement and generate a normalized value comprising a product of the first digital measurement and a gain value; and in the fine mode, receive the second digital measurement and generate the normalized value comprising the second digital measurement.

4. The adaptive TDC circuit of claim 3, further comprising a fractional TDC circuit, configured to, in each cycle of a system clock:
in the fine mode:
determine a residual time comprising a difference between the second digital measurement and the second input time interval;
determine an adjusted residual time based on the residual time and a residual time determined in a previous cycle of the system clock; and
append a least significant bit to the normalized value generated in the shift circuit to generate an adaptive TDC output, the least significant bit based on the adjusted residual time.

5. The adaptive TDC circuit of claim 1 comprises:
a first plurality of (N) delay buffers, each comprising a buffer input and a buffer output, coupled in a first series, wherein the buffer input of a first delay buffer in the first series is coupled to the start input;
a first plurality of (N) latches, each comprising:
a data input coupled to the buffer output of a corresponding one of the first N delay buffers in the first series;
a clock input coupled to the stop input; and
a data output;
a first decoder circuit coupled to the data outputs of the first N latches, the first decoder circuit configured to generate the first digital measurement;
a second plurality of (N) delay buffers, each comprising a buffer input and a buffer output, coupled in a second series, wherein the buffer input of a first delay buffer in the second series is coupled to the stop input;
a second plurality of (N) latches, each comprising:
a data input coupled to the buffer output of a corresponding one of the first N delay buffers;
a clock input coupled to the buffer output of a corresponding one of the second N delay buffers; and
a data output; and
a second decoder circuit coupled to the data outputs of the second N latches, the second decoder circuit configured to generate the second digital measurement.

6. The adaptive TDC circuit of claim 5, wherein:
each of the first N delay buffers comprises a first propagation delay from the buffer input to the buffer output, the first propagation delay corresponding to a first time granularity of the first digital measurement; and
each of the second N delay buffers comprises a second propagation delay between the buffer input and the buffer output, a difference between the first propagation delay and the second propagation delay corresponding to a second time granularity of the second digital measurement.

7. The adaptive TDC circuit of claim 6, wherein the first propagation delay is N times the difference between the first propagation delay and the second propagation delay.

8. The adaptive TDC circuit of claim 6, further comprising:
a TDC multiplexer coupled to the first decoder circuit and the second decoder circuit;
a start delay buffer comprising a buffer input coupled to the buffer output of a last delay buffer in the first series;
a stop delay buffer comprising a buffer input coupled to the buffer output of a last delay buffer in the second series; and a mode control latch comprising:
a data input coupled to the buffer output of the start delay buffer;
a clock input coupled to the buffer output of the stop delay buffer; and
a data output coupled to a control input of the TDC multiplexer.

9. The adaptive TDC circuit of claim 8, further comprising a bit-shift circuit configured to:
generate a normalized value comprising one of the second digital measurement and a bit-shifted value generated by bit-shifting the first digital measurement.

10. The adaptive TDC circuit of claim 8, wherein each of the first decoder circuit and the second decoder circuit comprises an enable input coupled to the data output of the mode storage element.

11. The adaptive TDC circuit of claim 9, wherein:
the second TDC circuit is further configured to generate the second digital measurement based on a first number of the second time granularity in the second time interval; and
the second time interval further comprises a residual time.

12. The adaptive TDC circuit of claim 11, wherein the second TDC circuit further comprises:
a first multiplexer circuit comprising a plurality of inputs, each coupled to the buffer output of a corresponding one of the first N delay buffers;
a second multiplexer circuit comprising a plurality of inputs, each coupled to the buffer output of a corresponding one of the second N delay buffers;
a multiplexer control circuit coupled to the data outputs of the second N latches and configured to:
determine, based on the second N latches, that the start signal propagated through the first number of the first N delay buffers and the stop signal propagated through the first number of the second N delay buffers;
control the first multiplexer circuit to couple the start signal that propagates through the first number of the first N delay buffers to a first multiplexer circuit output; and
control the second multiplexer circuit to couple the stop signal that propagates through the first number of the second N delay buffers to a second multiplexer circuit output.

13. The adaptive TDC circuit of claim 12, further comprising a fractional TDC circuit, configured to:
receive the start signal from the first multiplexer circuit output;
receive the stop signal from the second multiplexer circuit output;
determine the residual time based on a difference between the start signal and the stop signal.

14. The adaptive TDC circuit of claim 11, further comprising a fractional TDC circuit, configured to:
generate a least significant bit based on the residual time in a first cycle of a system clock and on a quantization error from a previous cycle of the system clock; and
append the least significant bit to the normalized value generated in the shift circuit to generate an adaptive TDC output.

15. The adaptive TDC circuit of claim 11, the circuit further comprising an adder circuit configured to:
receive an indication of the residual time in the first cycle;
receive the quantization error of the previous cycle; and
adjust the input time interval based on the quantization error to generate an adjusted time; and set a quantizer latch to indicate whether the adjusted residual time is positive or negative,
wherein the fractional bit is based on an output of the quantizer latch.

16. The adaptive TDC circuit of claim 14, the fractional TDC circuit, further comprising:
a quantization error circuit configured to generate the quantization error each cycle as a time difference between the second time granularity and the residual time; and
a quantization error delay circuit configured to provide the quantization error of the previous cycle to the adder circuit in the first cycle.

17. The adaptive TDC circuit of claim 14, the fractional TDC circuit, further comprising:
an initialization circuit configured to selectively provide one of the quantization errors of the previous cycle and an initialization signal to the adder circuit in the first cycle.

18. The adaptive TDC circuit of claim 14, the adder circuit, further comprising a sum hold circuit configured to store the adjusted time provided to the quantizer latch.

19. A phase-locked loop (PLL) circuit comprising:
a phase and frequency detection (PFD) circuit configured to generate a start signal and a stop signal separated by a time period based on a difference between a generated signal and a reference signal;
an adaptive time-to-digital converter (TDC) circuit, comprising:
a start input configured to receive the start signal;
a stop input configured to receive the stop signal;
a first TDC circuit configured to generate a first digital measurement of a first time period from a first voltage transition of the start signal at the start input to a first voltage transition of the stop signal at the stop input; and
a second TDC circuit configured to generate a second digital measurement of a second time period, non-overlapping with the first time period, from a second voltage transition of the start signal at the start input to a second voltage transition of the stop signal at the stop input,
wherein:
the first digital measurement and the second digital measurement each comprise a first number of bits; and
a first granularity of the first digital measurement is more coarse than a second granularity of the second digital measurement;
a loop filter coupled to the adaptive TDC circuit; and
a digitally-controlled oscillator (DCO) coupled to the loop filter circuit and configured to modify the generated signal based on the first digital measurement in response to the first time period and the second digital measurement in response to the second time period.

20. A method of converting time to a digital value in an adaptive time-to-digital converter (TDC) circuit, the method comprising:
receiving a start signal;
receiving a stop signal;
generating a first digital measurement of a first time period from a first voltage transition of the start signal at a start input to a first voltage transition of the stop signal at a stop input; and
generating a second digital measurement of a second time period, non-overlapping with the first time period, from a second voltage transition of the start signal at the start input to a second voltage transition of the stop signal at the stop input; and
generating, by a TDC multiplexer, a selected value comprising one of the first digital measurement and the second digital measurement,
wherein:
the first digital indication and the second digital indication each comprise a first number of bits; and
a first granularity of the first digital measurement is more coarse than a second granularity of the second digital measurement.

* * * * *